(12) United States Patent
Noguchi et al.

(10) Patent No.: US 10,900,888 B2
(45) Date of Patent: Jan. 26, 2021

(54) METHOD FOR EVALUATING TANTALUM CARBIDE

(71) Applicants: SHOWA DENKO K.K., Tokyo (JP); DENSO CORPORATION, Kariya (JP)

(72) Inventors: Shunsuke Noguchi, Hikone (JP); Nobuyuki Oya, Kariya (JP)

(73) Assignees: SHOWA DENKO K.K., Tokyo (JP); DENSO CORPORATION, Kariya (JP)

( * ) Notice: Subject to any disclaimer, the term of this patent is extended or adjusted under 35 U.S.C. 154(b) by 108 days.

(21) Appl. No.: 16/342,087

(22) PCT Filed: Nov. 7, 2017

(86) PCT No.: PCT/JP2017/040121
§ 371 (c)(1),
(2) Date: Apr. 15, 2019

(87) PCT Pub. No.: WO2018/088397
PCT Pub. Date: May 17, 2018

(65) Prior Publication Data
US 2019/0250096 A1    Aug. 15, 2019

(30) Foreign Application Priority Data
Nov. 8, 2016 (JP) ................................ 2016-218082

(51) Int. Cl.
*G01N 21/25* (2006.01)
*G01N 21/27* (2006.01)
*G01N 21/29* (2006.01)
*C30B 29/36* (2006.01)
*C30B 23/06* (2006.01)
*G01J 3/50* (2006.01)

(52) U.S. Cl.
CPC ........... *G01N 21/251* (2013.01); *C30B 23/06* (2013.01); *C30B 29/36* (2013.01); *G01J 3/50* (2013.01); *G01N 21/27* (2013.01); *G01N 21/293* (2013.01); *G01N 2201/062* (2013.01)

(58) Field of Classification Search
CPC . C30B 23/06; C30B 29/36; G01J 3/50; G01N 21/251; G01N 21/27; G01N 21/293; G01N 2201/062
See application file for complete search history.

(56) References Cited

U.S. PATENT DOCUMENTS

| | | | |
|---|---|---|---|
| 5,390,611 A * | 2/1995 | John ....................... | F23G 5/10 110/165 A |
| 2006/0158652 A1* | 7/2006 | Rooney .............. | G01N 21/8507 356/406 |
| 2014/0185927 A1 | 7/2014 | Kawabata et al. | |

FOREIGN PATENT DOCUMENTS

| | | |
|---|---|---|
| EP | 2 520 691 A1 | 7/2012 |
| JP | 53-092377 A | 8/1978 |
| JP | 2012-171812 A | 9/2012 |

(Continued)

OTHER PUBLICATIONS

Palechor-Tróchez et al. ("Relationship between Color CIEL*a*b* and Total Organic Carbon in Compost", Adv. in Mat. Sci. Eng., 2018) (Year: 2018).*

(Continued)

*Primary Examiner* — Hina F Ayub
(74) *Attorney, Agent, or Firm* — Sughrue Mion, PLLC

(57) ABSTRACT

In a method for evaluating tantalum carbide, a carbonization degree of tantalum carbide is evaluated by chromaticity.

5 Claims, 6 Drawing Sheets

(56) References Cited

FOREIGN PATENT DOCUMENTS

| JP | 2013-103848 A | 5/2013 |
| JP | 2013-238576 A | 11/2013 |
| JP | 2015-036189 A | 2/2015 |
| WO | 2011/081210 A1 | 7/2011 |
| WO | 2012/169592 A1 | 12/2012 |
| WO | 2014/011647 A1 | 1/2014 |

OTHER PUBLICATIONS

Communication dated Apr. 28, 2020 from Japanese Patent Office in JP Application No. 2016-218082.
Hisashi Suzuki et al., "Second, third properties of TaC-based hard metal alloy", Japan Society of Powder and Powder Metallurgy, Jul. 1981, pp. 179-182, vol. 28, No. 5.
International Search Report for PCT/JP2017/040121, dated Jan. 23, 2018.
Communication dated Oct. 8, 2019, from the Japanese Patent Office in Application No. 2016-218082.

* cited by examiner

மேthod FOR EVALUATING TANTALUM CARBIDE

METHOD FOR EVALUATING TANTALUM CARBIDE

CROSS REFERENCE TO RELATED APPLICATIONS

This Application is a National Stage of International Application No. PCT/JP2017/040121 filed Nov. 7, 2017, claiming priority based on Japanese Patent Application No. 2016-218082 filed Nov. 8, 2016, the content of which is incorporated herein by reference.

TECHNICAL FIELD

The present invention relates to a method for evaluating tantalum carbide.

BACKGROUND ART

Tantalum carbide has high hardness and excellent heat resistance. Tantalum carbide has an extremely high melting point of 3,880° C. Therefore, tantalum carbide is used as a material for various members which are used at high temperatures. For example, tantalum carbide is used for components of cutting tools, coatings of carbon heaters, concentrating solar cells, or members of semiconductor manufacturing equipments typified by SiC single crystals (see Patent Documents 1 and 2).

CITATION LIST

Patent Literature

[Patent Document 1] PCT International Publication No. WO2011/081210
[Patent Document 2] Japanese Unexamined Patent Application, First Publication No. 2015-36189
[Patent Document 3] Japanese Unexamined Patent Application, First Publication No. 2013-103848
[Patent Document 4] Japanese Unexamined Patent Application, First Publication No. 2012-171812

SUMMARY OF INVENTION

Technical Problem

Tantalum carbide is a carbide of tantalum whose composition formula is represented by TaC. Tantalum and carbon are present at 1:1 ratio in the stoichiometric composition ratio. However, in actual tantalum carbide, the ratio between tantalum and carbon may not be completely 1:1. For example, $TaC_{0.89}$ is known as a metastable state of tantalum carbide.

In a case where the ratio between tantalum and carbon of tantalum carbide departs from the stoichiometric composition ratio, the stability of tantalum carbide decreases. Therefore, for example, in a case where tantalum carbide is used for coating or the like, cracking or peeling may be caused. Cracking or peeling affects heat resistance, etching resistance, and the like of a member formed of tantalum carbide (see Patent Document 1).

Tantalum carbide in which the ratio between tantalum and carbon departs from the stoichiometric composition ratio may affect the growth environment of the semiconductor crystal in a semiconductor manufacturing equipment in a case where the tantalum carbide is used as a member of the semiconductor manufacturing equipment.

For example, in a case where a SiC single crystal is grown in a semiconductor manufacturing equipment using a member formed of tantalum carbide, the tantalum carbide having a low carbon ratio may absorb carbon and cause a fluctuation of the ratio of C to Si in the growth environment. The fluctuation of the ratio of C to Si during the growth of the SiC single crystal causes defects such as Si droplets and contamination of different polytypes (see Patent Documents 3 and 4).

In order to solve such problems, it is required to measure the actual composition ratio of tantalum carbide. The actual ratio between tantalum and carbon in tantalum carbide (hereinafter, may be referred to as "carbonization degree") can be analyzed by various analyzers.

However, it takes time and money to analyze the carbonization degree of tantalum carbide. Furthermore, when tantalum carbide is used as a member of an equipment or the like, it is necessary to break the member for the analysis. Since the member cannot be used after being broken, it is hard to break the member every time it is used.

The present invention is contrived in view of the above problems, and an object thereof is to provide a method for easily evaluating the carbonization degree of tantalum carbide.

Solution to Problem

The inventors have conducted intensive studies, and as a result, found that the carbonization degree of tantalum carbide can be analyzed by measuring the chromaticity of the surface of a member formed of tantalum carbide.

That is, the present invention provides the following method in order to solve the above problems.

(1) In a method for evaluating tantalum carbide according to an aspect of the present invention, a carbonization degree is evaluated by chromaticity.

(2) In the method for evaluating tantalum carbide according to the above aspect, the chromaticity may be measured by a CA color specification system.

(3) In the method for evaluating tantalum carbide according to the above aspect, the chromaticity may be obtained by a spectrophotometer or from an image photographed by a camera.

(4) In the method for evaluating tantalum carbide according to the above aspect, the tantalum carbide may be a member selected from a member formed of tantalum carbide and a member having a surface coated with tantalum carbide.

(5) In the method for evaluating tantalum carbide according to the above aspect, the member may be a member which is used for an equipment for SiC single crystal growth.

Advantageous Effects of Invention

According to the method for evaluating tantalum carbide of an aspect of the present invention, it is possible to easily evaluate the carbonization degree of tantalum carbide.

DESCRIPTION OF EMBODIMENTS

Figure 1:
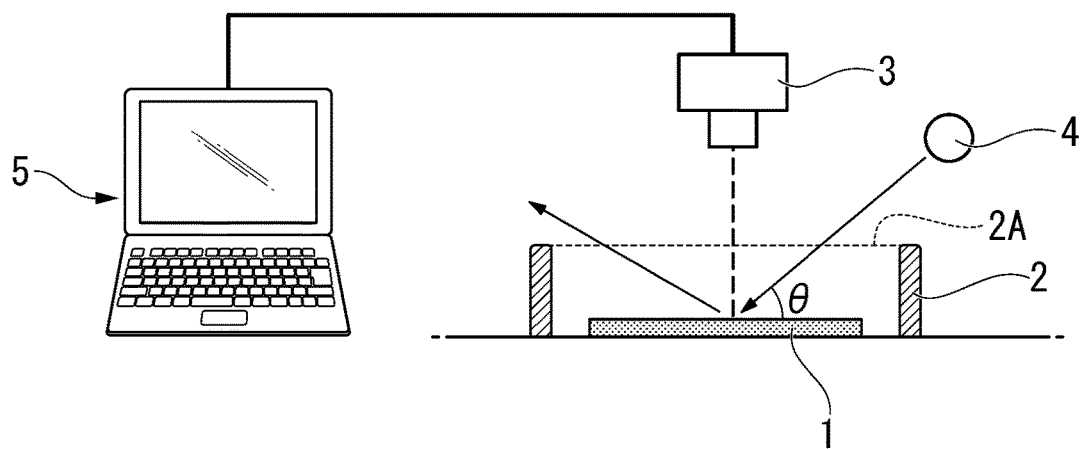
FIG. 1 is a diagram for illustrating a colorimetric method for a tantalum carbide test piece for a case where a camera is used.

Hereinafter, the present invention will be described in detail with appropriate reference to the drawings. In the drawings used in the following description, characteristic portions may be shown in an enlarged manner for the sake of convenience, and dimensional ratios of respective constituent elements and the like may be different from actual ones. Materials, dimensions, and the like exemplified in the following description are merely examples, and the present invention is not limited thereto. The present invention can be appropriately modified and implemented without changing the gist of the present invention.

In a method for evaluating tantalum carbide according to an aspect of the present invention, a carbonization degree is evaluated by chromaticity. Here, the "chromaticity" is a measure representing characteristics of a color represented by "hue" and "saturation".

In general, colors are expressed by three attributes of color, that is, hue, saturation, and brightness. The "chromaticity" is obtained by removing brightness from color.

Tantalum carbide varies in tint with an increase in the carbonization degree. Tantalum carbide becomes more reddish as a whole with an increase in the carbonization degree. Here, the "increase in the carbonization degree" means that the ratio of carbon in tantalum carbide is increased, and that the composition of the tantalum carbide approaches the stoichiometric composition ratio.

In this embodiment, the carbonization degree of tantalum carbide is evaluated by chromaticity. The inventors have found that the chromaticity of a color varies systematically as the carbonization degree of tantalum carbide varies.

Various methods can be used for evaluating the chromaticity. For example, visual evaluation using a color sample (color chart) or evaluation by a color specification system using a machine or the like can be used. In the colorimetry using a machine, the influence of individual differences can be eliminated, and thus it is possible to determine a slight color difference.

A spectrophotometer (colorimeter) can be used in performing the colorimetry using a machine. As the spectrophotometer, for example, SPECTROPHOTOMETER CM-2600d manufactured by Konica Minolta, Inc. can be used. As the measurement method, a SCI method including specularly reflected light or a SCE method excluding specularly reflected light may be used.

A spectrophotometer (colorimeter) can quantify a color by a color specification system. The color specification system to be used is not particularly limited. In the spectrophotometer (colorimeter), the L*a*b* color specification system, the L*C*h color specification system, the XYZ color specification system, and the like are widely adopted.

The L*a*b* color specification system is a color specification system established by the International Commission on Illumination (CIE). The Lab* color specification system is adopted in JIS Z8729, and most popularly used. In addition, the L*a*b* color specification system can separately express brightness and chromaticity by L representing the brightness and a* and b* representing the chromaticity. Therefore, the L*a*b* color specification system can be said to be suitable for chromaticity evaluation.

For example, in the evaluation of the carbonization degree of tantalum carbide in the L*a*b* color specification system, it has been confirmed that the carbonization degree increases with an increase in the value of a* or b*. This tendency can be confirmed from the relationship between a lattice constant of the crystal and the value of a* or b. The lattice constant of the crystal increases with an increase in the carbonization degree of tantalum carbide. Therefore, the carbonization degree of tantalum carbide can be derived from the relationship between the lattice constant of the crystal and the value of a orb.

The lattice constant of the crystal of tantalum carbide can be measured by an X-ray diffractometer (XRD).

In a case where a spectrophotometer cannot be prepared, a member formed of tantalum carbide may be photographed by a camera to obtain Lab from the photographed image.

FIG. 1 is a diagram for illustrating a colorimetric method for tantalum carbide for a case where a camera is used. Hereinafter, the colorimetric method for tantalum carbide for a case where a camera is used will be described in detail.

First, a tantalum carbide test piece 1 which is a measurement target, a box 2 having an opening portion 2A, a camera 3, a light source 4, and a data processor 5 are prepared.

The box 2 is installed such that the opening portion 2A is at the top, and the tantalum carbide test piece 1 is mounted inside the box.

In a case where the tantalum carbide test piece 1 cannot be mounted horizontally, a measurement surface of the tantalum carbide test piece 1 may be inclined with respect to the mounting surface. The box 2 prevents unnecessary light other than light from the light source 4 from reaching the measurement surface of the tantalum carbide test piece 1.

Next, the camera 3 and the light source 4 are installed. The camera 3 is installed at a position opposed to the measurement surface of the tantalum carbide test piece 1. It is preferable that a perpendicular line drawn from a lens of the camera 3 is orthogonal to the measurement surface of the tantalum carbide test piece 1. That is, it is preferable that the camera 3 is installed such that a line extending from the center of the lens of the camera 3 in a measurement direction is orthogonal to the measurement surface of the tantalum carbide test piece 1.

The light source 4 is positioned such that incident light from the light source 4 and the measurement surface of the tantalum carbide test piece 1 form a predetermined inclination angle θ. The inclination angle θ is not particularly limited as long as the conditions for each measurement are unified.

A plurality of light sources 4 may be provided. In a case where a plurality of light sources 4 are provided, it is possible to avoid that a shadow is formed inside the box 2 and lies over the measurement surface of the tantalum carbide test piece 1. Even in a case where a plurality of light sources 4 are provided, the conditions for each measurement are unified.

A white light source is used as the light source 4. An average color rendering index (Ra) of the white light source is preferably 50 or greater, and more preferably 90 or greater. Specifically, a fluorescent lamp, an LED, or the like can be used as the light source 4.

The average color rendering index (Ra) of the white light source is a value based on the standards of JIS Z8726.

In a case where the tantalum carbide test piece 1, the camera 3, and the light source 4 are installed at predetermined positions, the tantalum carbide test piece 1 is photographed by the camera 3. The number of times of photographing is not limited to one, and for example, photographing may be performed a plurality of times while the inclination angle θ formed between the light source 4 and the measurement surface is changed.

The image photographed by the camera 3 is read to the data processor 5. A commercially available computer can be used as the data processor 5. The data processor 5 reads the color of the tantalum carbide test piece 1 in RGB values.

Next, the obtained RGB values are converted to an XYZ color space, and then further converted to a Lab color space. In this case, brightness correction may be performed on the RGB values. The brightness correction may be performed on the image displayed on the screen of the computer such that the image has natural brightness on the screen. Only the chromaticity is to be evaluated, and the brightness does not affect the measurement results. Therefore, the results are not affected even in a case where the brightness is corrected.

A known method can be used as the method for correction from the RGB values to the XYZ color space. Converting to the XYZ color space is possible by multiplying the RGB values by a predetermined conversion matrix M. The RGB values change the value of the conversion matrix M depending on whether sRGB or Adobe RGB is used.

Next, the XYZ space is converted to the Lab color space. In the Lab color space, the color is expressed by three numerical values L*a*b*. Accordingly, due to this conversion, the same index as in the measurement result of the spectrophotometer (colorimeter) can be used.

In the XYZ space converted from the RGB values, D65 is used as a standard light source. In the Lab color space, D50 is usually used as a standard light source, and thus it is necessary to correct the reference point. Such conversion of the value is called Bradford conversion.

Conversion from the value of the XYZ space with D50 converted as a standard light source to the Lab color space is performed. This conversion can be performed using a known function f (t). Specifically, Expressions (1) to (4) are used to perform the conversion.

[Expression 1]

$$f(t) = \begin{cases} t^{1/3} & t > (6/29)^3 = 0.008856... \\ [(29/3)^3 t + 16]/116 & t \leq (6/29)^3 = 0.008856... \end{cases} \quad (1)$$

[Expression 2]

$$L^* = 116 f(Y/Yn) - 16 \quad (2)$$

[Expression 3]

$$a^* = 500[f(X/Xn) - f(Y/Yn)] \quad (3)$$

[Expression 4]

$$b^* = 200[f(Y/Yn) - f(Z/Zn)] \quad (4)$$

In Expressions (1) to (4), Xn, Yn, and Zn are white point coordinates, and X, Y, and Z are actual values of X, Y, and Z.

With this procedure, L*a*b* can be obtained from the photographed image.

Even in a case where the conditions are kept constant, some variation may occur in images photographed by people. However, in the results actually measured by the evaluation method according to this embodiment, it is possible to sufficiently confirm the correlation between the carbonization degree and the chromaticity even in a case where the values of L*a*b* converted from the photographed image are used. In other words, the carbonization degree can be said to be sufficiently confirmed by chromaticity even in a case where there is some variation. This method is more easily performed since there is no need to prepare a special device for colorimetry.

As described above, according to the evaluation method of this embodiment, the carbonization degree of tantalum carbide can be evaluated by color. Since different carbonization degrees are required for different uses, a threshold can be optionally set. For example, in a case where tantalum carbide is used as a coating material for a carbon heater in a semiconductor manufacturing equipment, the carbonization degree is desirably close to 1.0, and preferably 0.85 or greater in order to enhance the stability of the tantalum carbide.

Tantalum carbide to be measured may be a member formed of the tantalum carbide only, or a member coated with the tantalum carbide. The thickness of the tantalum carbide coating is preferably 0.1 μm or greater and 1,000 μm or less. A tantalum carbide powder may be measured.

EXAMPLES

Example 1

A metal, that is, tantalum was brought into contact with graphite and heated, and the heating time was changed to prepare a plurality of tantalum carbide test pieces having different carbonization degrees. The obtained tantalum carbide test pieces had different colors. The obtained tantalum carbide test piece was analyzed by an X-ray diffractometer (XRD), and the lattice constant of the crystal was measured. The color was measured by a SCI method using SPECTRO-PHOTOMETER CM-2600d manufactured by Konica Minolta, Inc.

Figure 2:
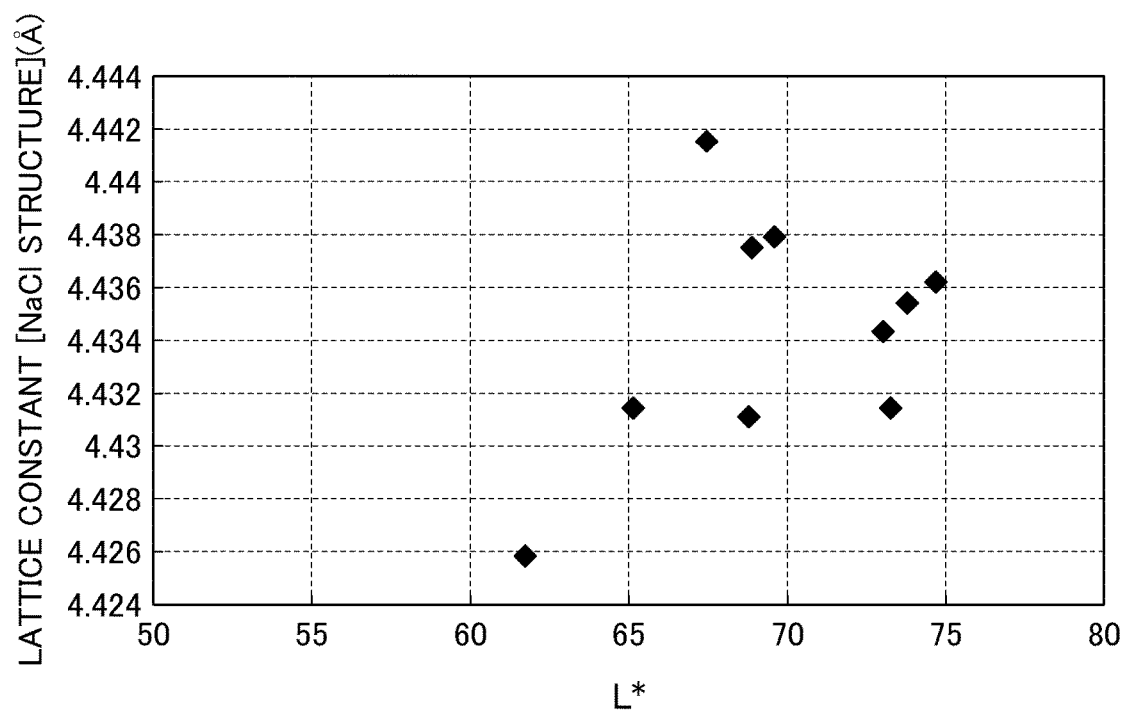
FIG. 2 is a diagram showing a relationship between L* values obtained by measuring tantalum carbide test pieces with a spectrophotometer and lattice constants (Å) of crystals obtained by XRD.
Figure 3:
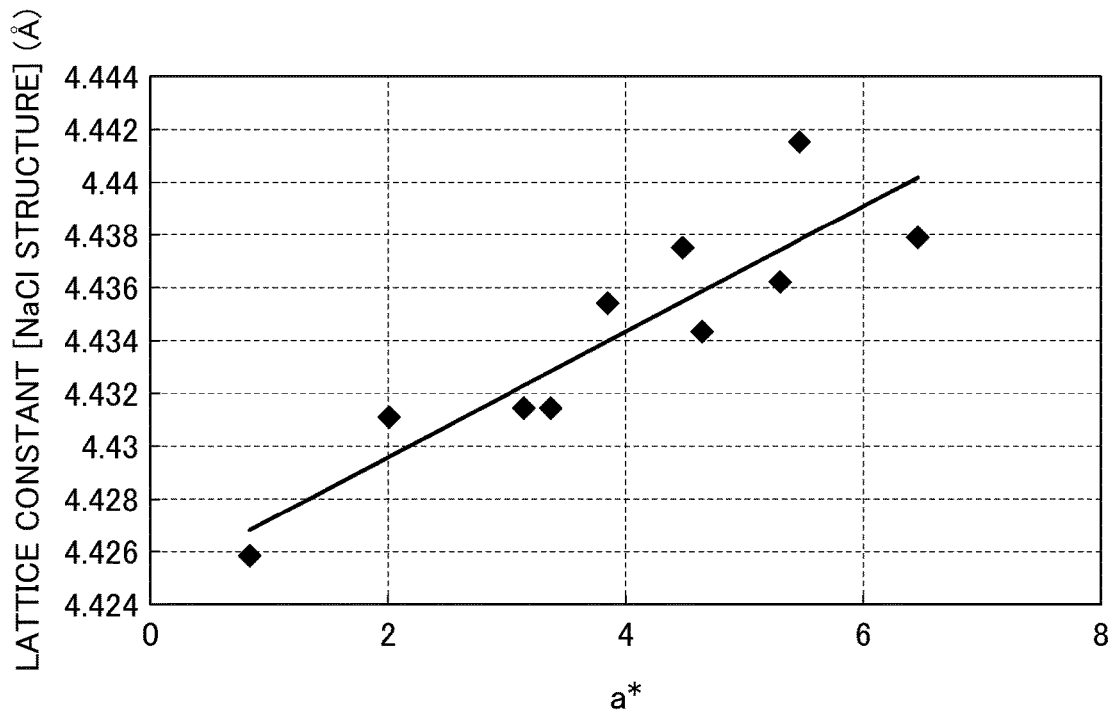
FIG. 3 is a diagram showing a relationship between a* values obtained by measuring the tantalum carbide test pieces with a spectrophotometer and lattice constants (Å) of crystals obtained by XRD.
Figure 4:
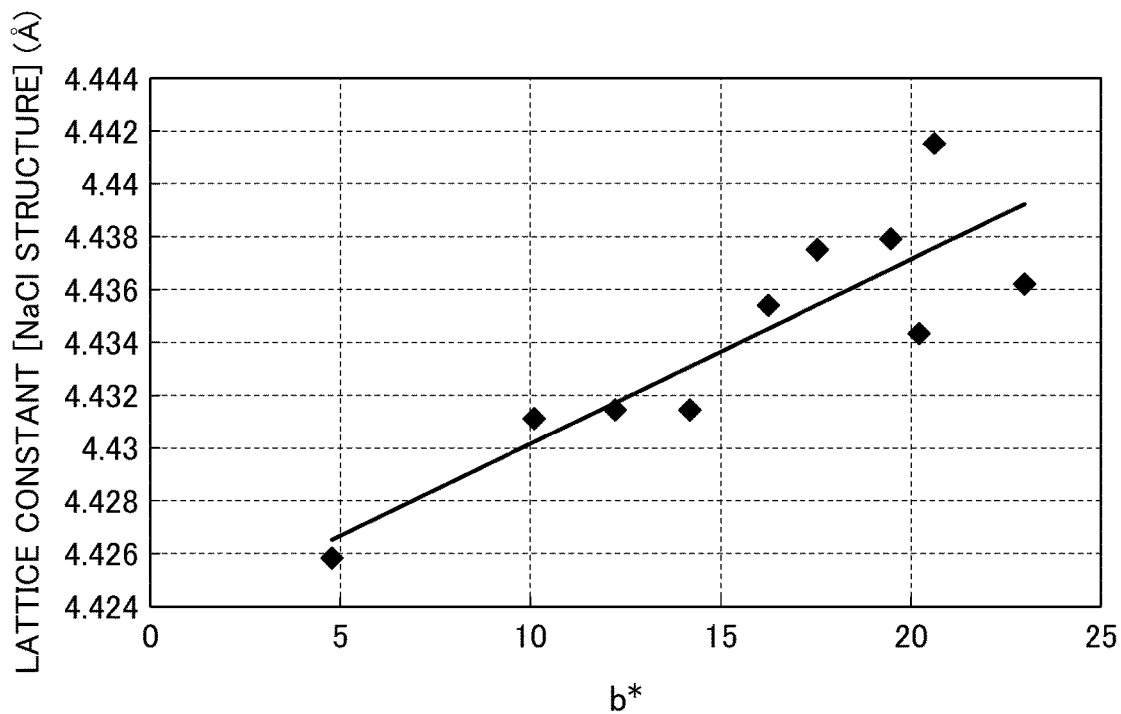
FIG. 4 is a diagram showing a relationship between b* values obtained by measuring the tantalum carbide test pieces with a spectrophotometer and lattice constants (Å) of crystals obtained by XRD.

FIG. 2 is a diagram showing a relationship between L* values obtained by measuring the plurality of tantalum carbide test pieces with a spectrophotometer and lattice constants (Å) of crystals obtained by XRD. FIG. 3 is a diagram showing a relationship between a* values obtained by measuring the plurality of tantalum carbide test pieces with a spectrophotometer and lattice constants (Å) of crystals obtained by XRD. FIG. 4 is a diagram showing a relationship between b* values obtained by measuring the plurality of tantalum carbide test pieces with a spectrophotometer and lattice constants (Å) of crystals obtained by XRD.

As shown in FIG. 2, the lattice constant of the crystal varies with respect to the value of the L* value. That is, no correlation can be confirmed between the brightness (L* value) and the lattice constant. In contrast, as shown in FIG. 3, it is found that the larger the a value and the b value, the larger the lattice constant.

In a case where the carbonization degree of the tantalum carbide test piece increases, carbon atoms are taken into the crystal structure. Since the lattice constant increases with an increase in the carbonization degree, the lattice constant and the carbonization degree have a certain correlation. Therefore, the carbonization degree of the tantalum carbide test piece can be obtained from the chromaticity (a* value and b* value).

Figure 5:
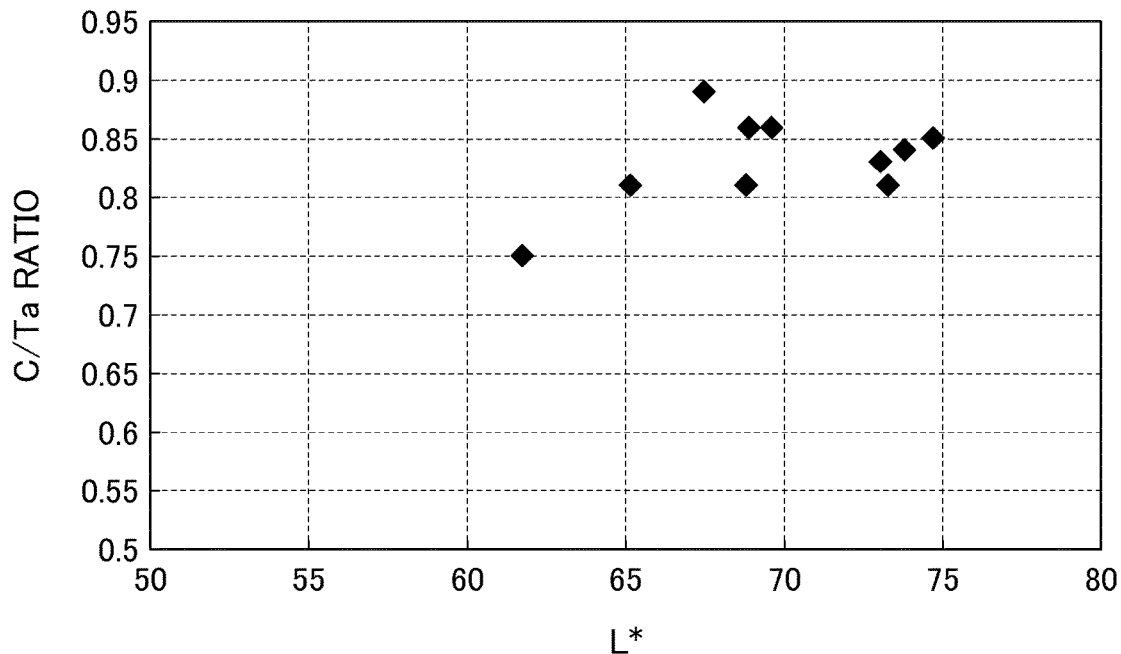
FIG. 5 is a diagram showing a relationship between L* values obtained by measuring the tantalum carbide test pieces with a spectrophotometer and carbonization degrees (C/Ta ratio).
Figure 6:
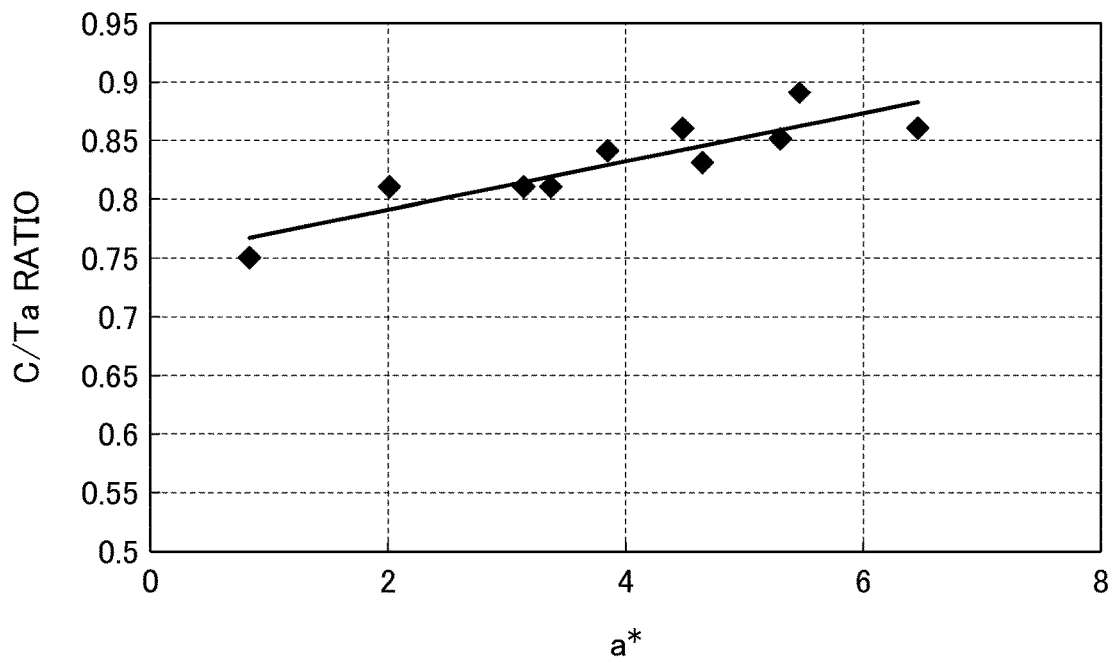
FIG. 6 is a diagram showing a relationship between a* values obtained by measuring the tantalum carbide test pieces with a spectrophotometer and carbonization degrees (C/Ta ratio).
Figure 7:
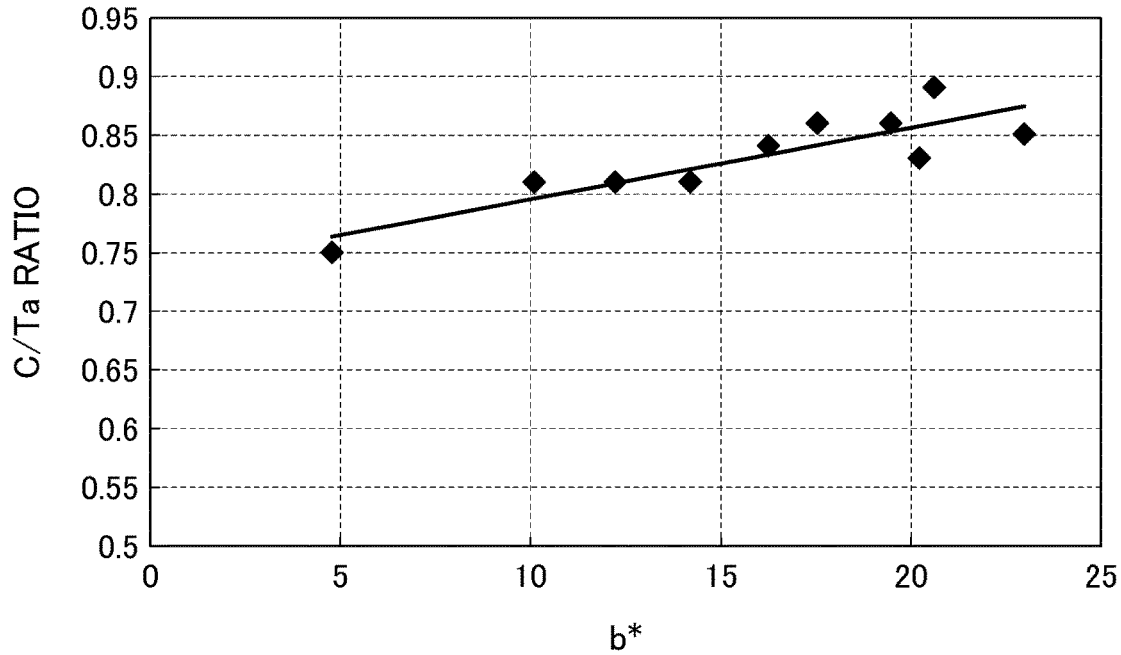
FIG. 7 is a diagram showing a relationship between b* values obtained by measuring the tantalum carbide test pieces with a spectrophotometer and carbonization degrees (C/Ta ratio).

FIGS. 5 to 7 are graphs in which the lattice constant of FIGS. 2 to 4 is replaced by the carbonization degree (C/Ta ratio). That is, FIG. 5 is a diagram showing a relationship between L* values obtained by measuring the plurality of tantalum carbide test pieces with a spectrophotometer and carbonization degrees (C/Ta ratio). FIG. 6 is a diagram showing a relationship between a* values obtained by measuring the plurality of tantalum carbide test pieces with a spectrophotometer and carbonization degrees (C/Ta ratio). FIG. 7 is a diagram showing a relationship between b* values obtained by measuring the plurality of tantalum carbide test pieces with a spectrophotometer and carbonization degrees (C/Ta ratio).

The lattice constant of the crystal of tantalum carbide was measured by an X-ray diffractometer (XRD). The carbonization degree (C/Ta ratio) of each of the plurality of tantalum carbide test pieces was calculated using the lattice constant.

As shown in FIGS. 5 to 7, it can be confirmed that the carbonization degree of the tantalum carbide test piece has no correlation with the brightness (L* value), but correlates with the chromaticity (a value and b value). It can be confirmed that the larger the a value or the b value, the higher the carbonization degree.

Example 2

Example 2 is different from Example 1 in that color evaluation is performed by photographing. Regarding conditions for photographing, one light source was used, and the measurement was performed at four points with an inclination angle of 5° to 80° between the light source and the measurement surface. The average of the measurement values was adopted.

Figure 8:
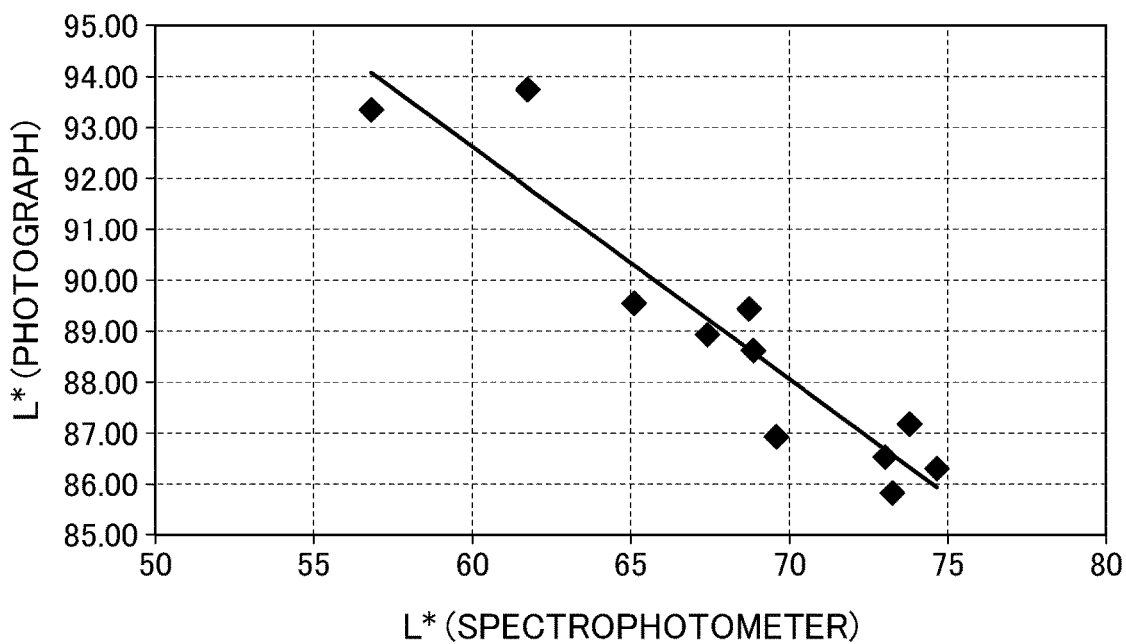
FIG. 8 is a diagram showing a relationship between L* values obtained by measuring the tantalum carbide test pieces with a spectrophotometer and L* values obtained from photographed images.
Figure 9:
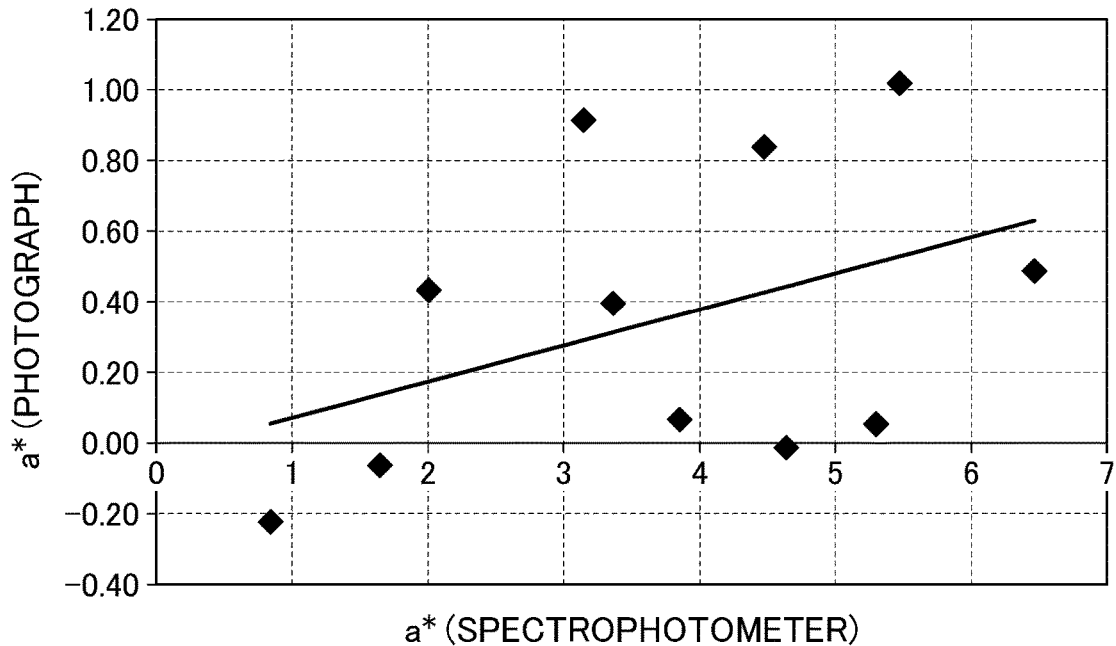
FIG. 9 is a diagram showing a relationship between a* values obtained by measuring the tantalum carbide test pieces with a spectrophotometer and a* values obtained from photographed images.
Figure 10:
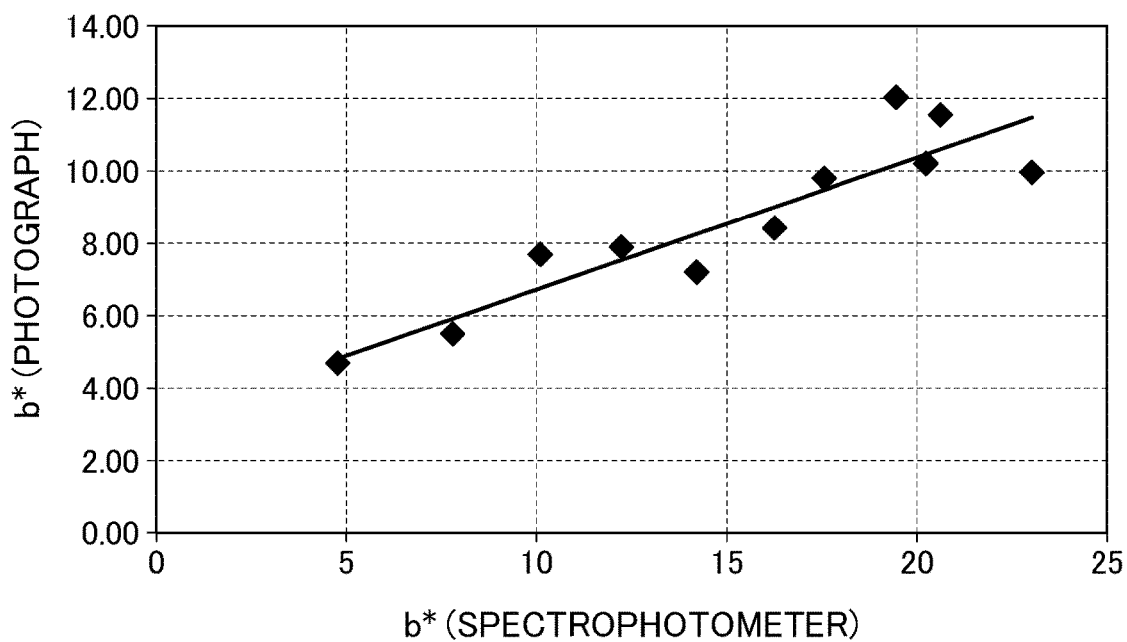
FIG. 10 is a diagram showing a relationship between b* values obtained by measuring the tantalum carbide test pieces with a spectrophotometer and b* values obtained from photographed images.

FIG. 8 is a diagram showing a relationship between L* values measured with a spectrophotometer and L* values obtained from photographed images. FIG. 9 is a diagram showing a relationship between a* values measured with a spectrophotometer and a* values obtained from photographed images. FIG. 10 is a diagram showing a relationship between b* values measured with a spectrophotometer and b values obtained from photographed images.

As shown in FIGS. 8 and 9, the L*a*b* values measured with the spectrophotometer and the L*a*b* values obtained from the photographed images do not always match since the precision and the like of the measurement conditions and the like are different.

However, in FIG. 10, the b* value obtained from the photographed images has been confirmed to be correlated with the b value measured with the spectrophotometer. That is, the above fact indicates that the b* value obtained from the photographed image can be used as an index.

Figure 11:
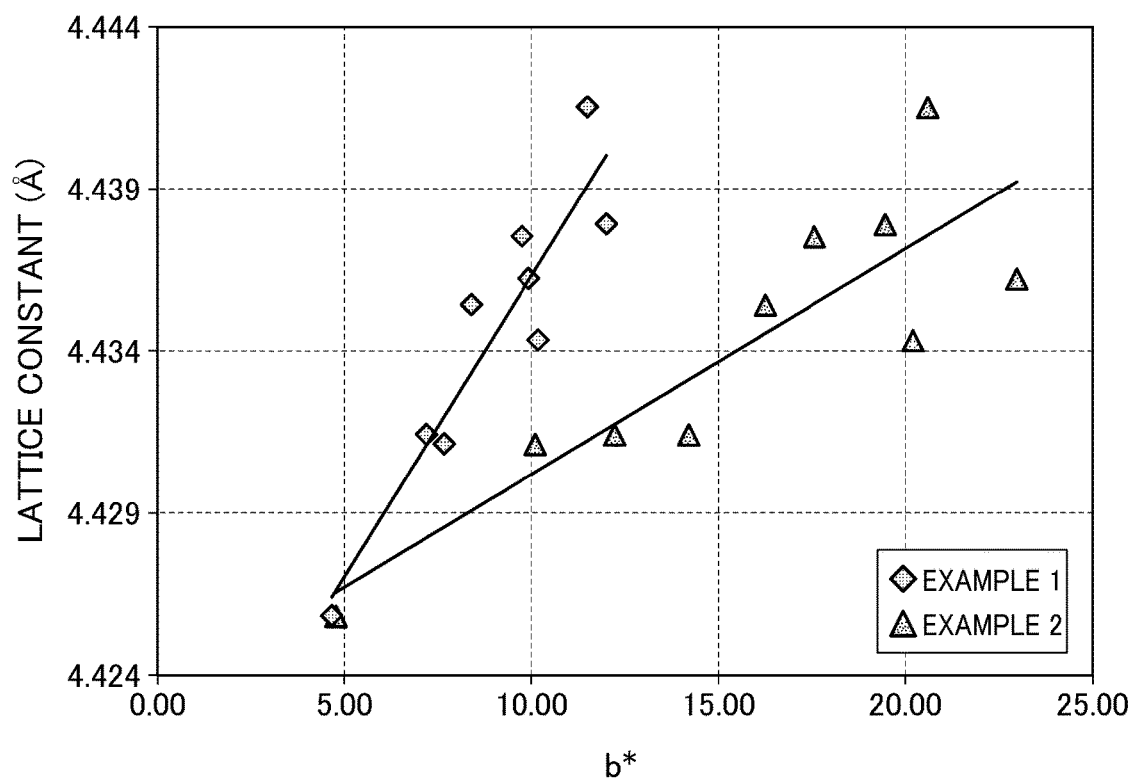
FIG. 11 is a diagram showing a relationship between b* values obtained by measuring the tantalum carbide test pieces with a spectrophotometer and lattice constants (Å) of crystals obtained by XRD and a relationship between b* values obtained from photographed images and the lattice constants (Å) of crystals obtained by XRD.

FIG. 11 is a diagram showing a relationship between b* values measured with a spectrophotometer and lattice constants (Å) of crystals obtained by XRD and a relationship between b* values obtained from photographed images and the lattice constants (Å) of crystals obtained by XRD. In any case, it has been confirmed that the larger the b* value, the larger the lattice constant. That is, the larger the b* value, the higher the carbonization degree.

Since the absolute value of the b* value measured with the spectrophotometer is different from the absolute value of the b* value obtained from the photographed image, a calibration curve is preferably obtained for each data in estimating the carbonization degree from the b* value.

REFERENCE SIGNS LIST

1: TANTALUM CARBIDE TEST PIECE
2: BOX
2A: OPENING PORTION
3: CAMERA
4: LIGHT SOURCE
5: DATA PROCESSOR

The invention claimed is:
1. A method for evaluating tantalum carbide,
   wherein a carbonization degree is evaluated by chromaticity.
2. The method for evaluating tantalum carbide according to claim 1,
   wherein the chromaticity is measured by a L*a*b* color specification system.
3. The method for evaluating tantalum carbide according to claim 1,
   wherein the chromaticity is obtained by a spectrophotometer or from an image photographed by a camera.
4. The method for evaluating tantalum carbide according to claim 1,
   wherein the tantalum carbide is a member selected from a member formed of tantalum carbide and a member having a surface coated with tantalum carbide.
5. The method for evaluating tantalum carbide according to claim 4,
   wherein the member is a member which is used for an equipment for SiC single crystal growth.

* * * * *